United States Patent [19]
Sawada et al.

[11] Patent Number: 5,404,032
[45] Date of Patent: Apr. 4, 1995

[54] FIELD-EFFECT SEMICONDUCTOR DEVICE

[75] Inventors: Minoru Sawada; Yasoo Harada, both of Moriguchi, Japan

[73] Assignee: Sanyo Electric Co., Ltd., Moriguchi, Japan

[21] Appl. No.: 109,354

[22] Filed: Aug. 20, 1993

[30] Foreign Application Priority Data

Aug. 26, 1992 [JP] Japan ................... 4-227121
Mar. 22, 1993 [JP] Japan ................... 5-062163
Jun. 22, 1993 [JP] Japan ................... 5-150560

[51] Int. Cl.⁶ ............... H01L 29/161; H01L 29/80
[52] U.S. Cl. ................... 257/192; 257/191; 257/194; 257/615
[58] Field of Search ........... 257/192, 194, 191, 195, 257/607, 613, 615, 655

[56] References Cited

U.S. PATENT DOCUMENTS

| | | | |
|---|---|---|---|
| 5,091,759 | 2/1992 | Shih et al. | 257/194 |
| 5,099,295 | 3/1992 | Ogawa | 257/194 |
| 5,206,527 | 4/1993 | Kuwata | 257/192 |

FOREIGN PATENT DOCUMENTS

| | | | |
|---|---|---|---|
| 3291944 | 12/1991 | Japan | 257/192 |
| 5-67056 | 9/1993 | Japan . | |

OTHER PUBLICATIONS

"The Backside Pulse Doped Channel Heterostructure Field-Effect Transistor: Design, DC, and RF Performance"—Jpn. J. Appl. Phys. vol. 32 (1993) pp. 17-25 Part 1, No. 1A, Jan. 1993.

"Very High Power–Added Efficiency and Low–Noise 0.15-$\mu$m Gate-Length Pseudomorphic HEMT's'-'–IEEE Electron Device Letters, vol. 10, No. 12, Dec. 1989.

"Low–Noise Characteristics of Pulse-Doped GaAs MESFET's with Planar Self-Aligned Gates"–IEEE Transactions On Electron Devices. vol. 39, No. 4, Apr. 1992.

*Primary Examiner*—Mark V. Prenty
*Attorney, Agent, or Firm*—Darby & Darby

[57] ABSTRACT

A novel field-effect semiconductor device having both low-noise and high-output operating characteristics has a first semiconductor buffer layer, an undoped second semi-conductor layer, an undoped third semiconductor layer the forbidden band gap of which increases from the substrate to the electrode side, a fourth semiconductor layer of one conductivity type, and a fifth semiconductor layer of undoped type or one conductivity type, formed one on top of another in this order on a semiconductor substrate. When the gate potential is deep, electrons mostly travel through the undoped second and third semiconductor layers, the device exhibiting superior low-noise characteristic; when the gate potential is shallow, electrons mostly travel through the highly doped fourth semiconductor layer, the device thus achieving high output characteristic.

14 Claims, 16 Drawing Sheets

FIELD-EFFECT SEMICONDUCTOR DEVICE

BACKGROUND OF THE INVENTION

1. Field of the Invention

The present invention relates to a field-effect semiconductor device, and more particularly to a novel field-effect semiconductor device realizing both low-noise and high-output operating characteristics.

2. Description of Related Art

With increasing demand for satellite broadcast receiver systems, attention has been directed to improvements in the performance of super-low-noise field-effect transistors that constitute the important parts of such systems. To improve the performance of this type of transistor, it is essential to reduce the gate length or increase transconductance, etc.

The present inventors have already proposed, in Japanese Patent Application Laid-Open No. 3-316426 (1991), a field-effect semiconductor device designed to reduce the noise figure during high frequency operation while satisfying the above requirements.

FIG. 1 is a schematic cross-sectional view showing the structure of the field-effect transistor disclosed in the above-said Patent Application. In the figure, the reference numeral 1 designates a semi-insulating GaAs substrate, on which an undoped GaAs layer 2 as a buffer layer, an undoped InGaAs layer 3, an n-type n-InGaAs layer 4, an n-type n-AlGaAs layer 5, and an n-type n-GaAs layer 6 as a capping layer are formed one on top of another in this order. A source electrode 7 is connected to one side of the n-GaAs layer 6 to the other side of which is connected a drain electrode 8. Formed between the source electrode 7 and the drain electrode 8 is a gate electrode 9 forming a Schottky junction with the n-AlGaAs layer 5.

Since it is difficult to reduce noise when electrons flow through a highly doped semiconductor layer, the structure of the above field-effect transistor is such that some of the electrons are passed through the undoped InGaAs layer 3 during transistor operation in order to suppress the generation of noise.

However, with the above structure, it is not possible to suppress the generation of noise below a satisfactory level; to meet the recently increasing needs for lower noise operation, a further reduction in the noise figure is demanded.

Another prior art related to the present invention is a MESFET structure that uses as the channel layer an n-$In_xGa_{1-x}As$ layer with the composition ratio of In varied in a graded manner (Japanese Patent Application Laid-Open No. 64-57677(1989)). With this structure, however, it is difficult to reduce the noise figure since electrons travel through the doped semiconductor layer (n-$In_xGa_{1-x}As$ layer).

SUMMARY OF THE INVENTION

A primary object of the invention is to provide a field-effect semiconductor device capable of high output operation while at the same time, achieving a significant reduction in the noise figure by further suppressing the generation of noise.

In the field-effect semiconductor device of the present invention, the n-InGaAs layer 4 or both of the InGaAs layer 3 and n-InGaAs layer 4 shown in FIG. 1, for example, are replaced by an n-GaAs layer and an undoped $In_xGa_{1-x}As$ layer, the composition ratio of In decreasing in a graded manner from the substrate to the electrode side.

According to a first invention, there is provided a field-effect semiconductor device which comprises a first semiconductor buffer layer, an undoped second semiconductor layer, an undoped third semiconductor layer, a fourth semiconductor layer of one conductivity type, and a fifth semiconductor layer of undoped type or one conductivity type, formed one on top of another in this order on a semiconductor substrate, wherein the electron affinity of the second semiconductor layer is greater than that of the first semiconductor buffer layer, the electron affinity of the third semiconductor layer at the interface with the second semiconductor layer is not greater than that of the second semiconductor layer, the forbidden band gap of the third semiconductor layer increases in a graded manner from the second semiconductor layer to the fourth semiconductor layer side, the electron affinity of the third semiconductor layer at the interface with the fourth semiconductor layer is not smaller than that of the fourth semiconductor layer, and the electron affinity of the fifth semiconductor layer is not greater than that of the fourth semiconductor layer.

According to a second invention, there is provided a field-effect semiconductor device which comprises a first semiconductor buffer layer, an undoped second semiconductor layer, a third semiconductor layer of one conductivity type, and a fourth semiconductor layer of undoped type or one conductivity type, formed one on top of another in this order on a semiconductor layer, wherein the electron affinity of the second semiconductor layer at the interface with the first semiconductor buffer layer is greater than that of the first semiconductor buffer layer, the forbidden band gap of the second semiconductor layer increases in a graded manner from the first semiconductor buffer layer to the third semiconductor layer side, the electron affinity of the second semiconductor layer at the interface with the third semiconductor layer is not smaller than that of the third semiconductor layer, and the electron affinity of the fourth semiconductor layer is not greater than that of the third semiconductor layer.

In the field-effect semiconductor device of the present invention, since the undoped semiconductor layer is formed whose forbidden band gap increases in a graded manner from the substrate to the electrode side, the bandgap inclines in this region, and the source resistance is reduced. The field-effect semiconductor device of the invention has two electron transport modes: when the gate potential is deep, electrons mostly travel through the undoped semiconductor layer; when the gate potential is shallow, electrons mostly travel through the highly doped layer. Accordingly, when the gate potential is deep, the electrons tend to move through portions spaced away from the impurity doped regions and therefore less susceptible to the effects of impurities, thus achieving further suppression of noise, and hence superior low-noise performance. On the other hand, when the gate potential is shallow, high output performance can be achieved.

The above and further objects and features of the invention will more fully be apparent from the following detailed description with accompanying drawings.

DESCRIPTION OF THE PREFERRED EMBODIMENTS

The preferred embodiments of the invention will be described in detail below with reference to the accompanying drawings.

(First Embodiment)

Figure 1:
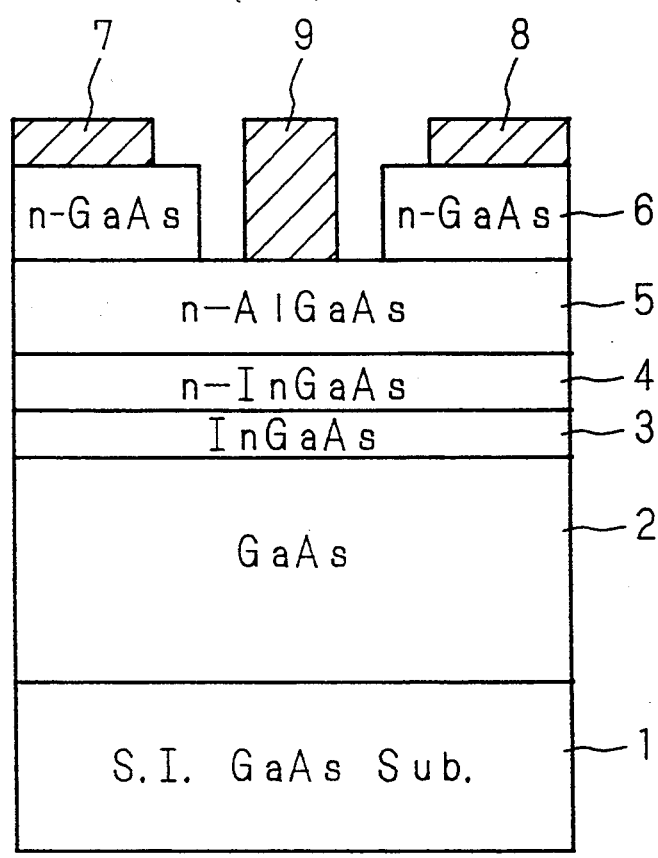
FIG. 1 is a schematic cross-sectional view showing the structure of a prior art field-effect transistor.
Figure 2:
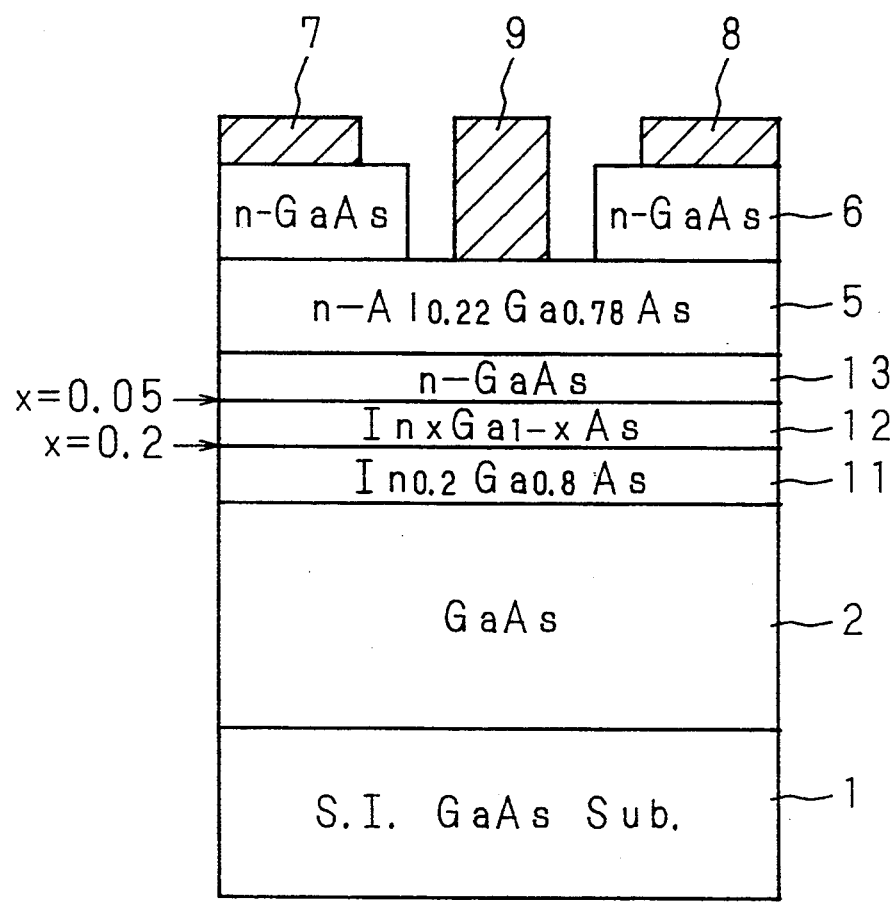
FIG. 2 is a schematic cross-sectional view showing the structure of a field-effect transistor according to a first embodiment of the invention.

FIG. 2 is a schematic cross-sectional view showing the structure of a field-effect transistor according to the first invention. In the figure, the reference numeral 1 designates a semi-insulating GaAs substrate (a semiconductor substrate). On the GaAs substrate 1, the following layers are formed one on top of another in the order stated: an undoped GaAs layer 2 as a buffer layer (a first buffer layer) (thickness: up to 8000 Å); n undoped InGaAs layer 11 (a second semi conductor layer) (composition ratio of In: 0.2, thickness: 50 Å); an undoped In $Ga_{1-x}$As layer 12 (a third semiconductor layer) with time composition ratio of In decreasing in a graded manner from the substrate to the electrode side (composition ratio of In: 0.2 (substrate side), 0.05 (electrode side), thickness: 50 Å); an n-type n-GaAs layer 13 (a fourth semiconductor layer) (doping concentration: $1.5 \times 10^{18}$ cm$^{-3}$, thickness: 400 Å); an n-type n-AlGaAs layer 5 (a fifth semiconductor layer) (composition ratio of Al: 0.22, doping concentation: $2 \times 10$ cm$^{-3}$, thickness: 400 Å); and an n-type n-GaAs layer 6 as a capping layer (doping concentration: $3 \times 10^{18}$ cm$^{-3}$, thickness: 500 Å). In this embodiment, the combined thickness of the InGaAs layer 11, In$_x$Ga$_{1-x}$As layer 12, and n-GaAs layer 13, sandwiched between the GaAs layer 2 and the n-AlGaAs layer 5, is made large enough that the potential well formed by the conduction band potential difference between the GaAs layer 2 and the n-AlGaAs layer 5 cannot provide the effect of quantum-mechanical electron confinement. That is, these are not made to form a single quantum well. A source electrode 7 is connected to one side of the n-GaAs layer 6 to the other side of which is connected a drain electrode 8. Formed between the source electroide 7 and the drain electrode 8 is a gate electrode 9 (gate length: 0.2 μm, gate width: 200 μm) forming a Schottky junction with the n-AlGaAs layer 5.

Figure 3:
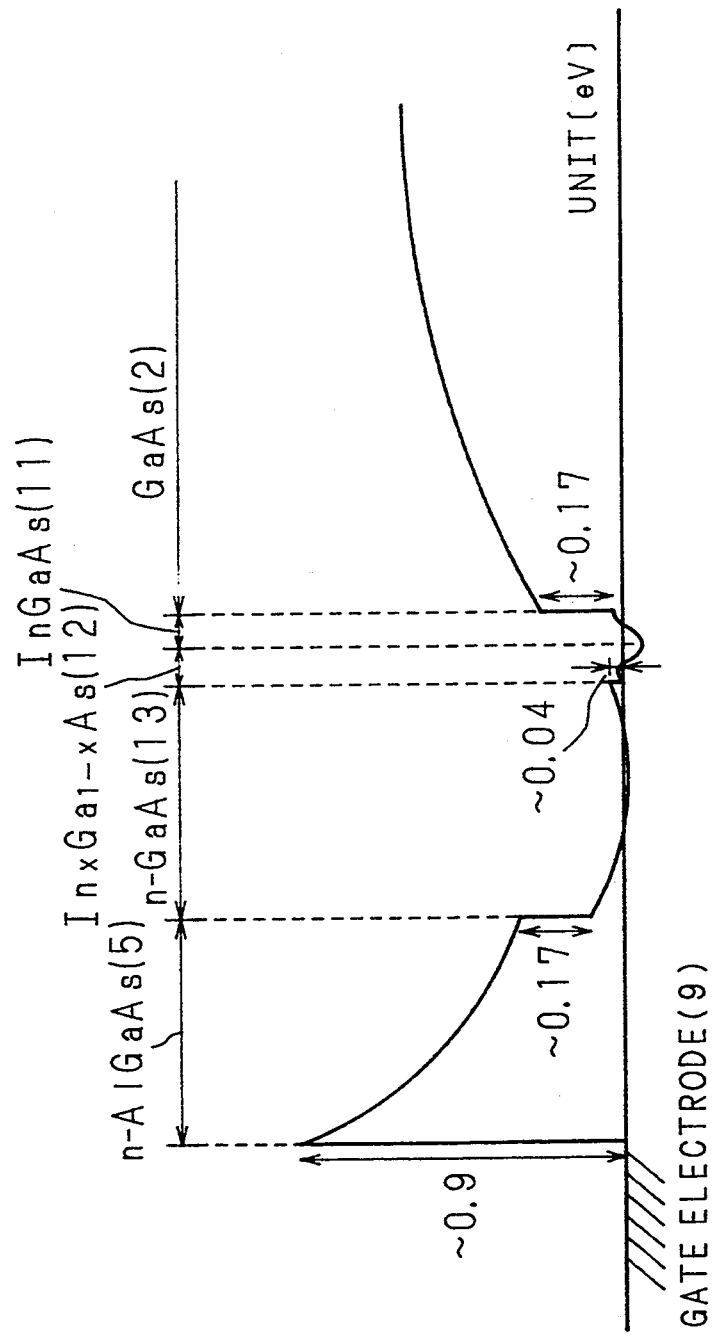
FIG. 3 is a diagram showing a conduction band directly below the gate electrode of the field-effect transistor shown in FIG. 2.

FIG. 3 shows the conduction band directly below the gate electrode 9 in the field-effect transistor of the above structure. The numbers in the figure show approximate values obtained by calculation. In the undoped In$_x$Ga$_{1-x}$As layer 12, the composition ratio of In decreases in a graded manner, which causes the energy band to incline. Accordingly, there exist two electron transport modes: when the gate potential is deep, electrons mostly travel through the In$_x$Ga$_{1-x}$As layer 12 and InGaAs layer 11; when the gate potential is shallow, electrons mostly travel through the n-GaAs layer 13. As a result, when the gate potential is deep, superior low-noise characteristic is exhibited, and when the gate potential is shallow, high output characteristic is achieved. That is, when the gate potential is deep, the electrons supplied from the n-GaAs layer 13 are excellently confined in the quantum wells in the In$_x$Ga$_{1-x}$As layer 12 and InGaAs layer 11, thus providing superior low-noise performance. On the other hand, when the gate potential is shallow, the highly doped n-GaAs layer 13 acts as the channel, so that a high, flat transconductance is obtained and high output performance is achieved.

(Second Embodiment)

Figure 4:
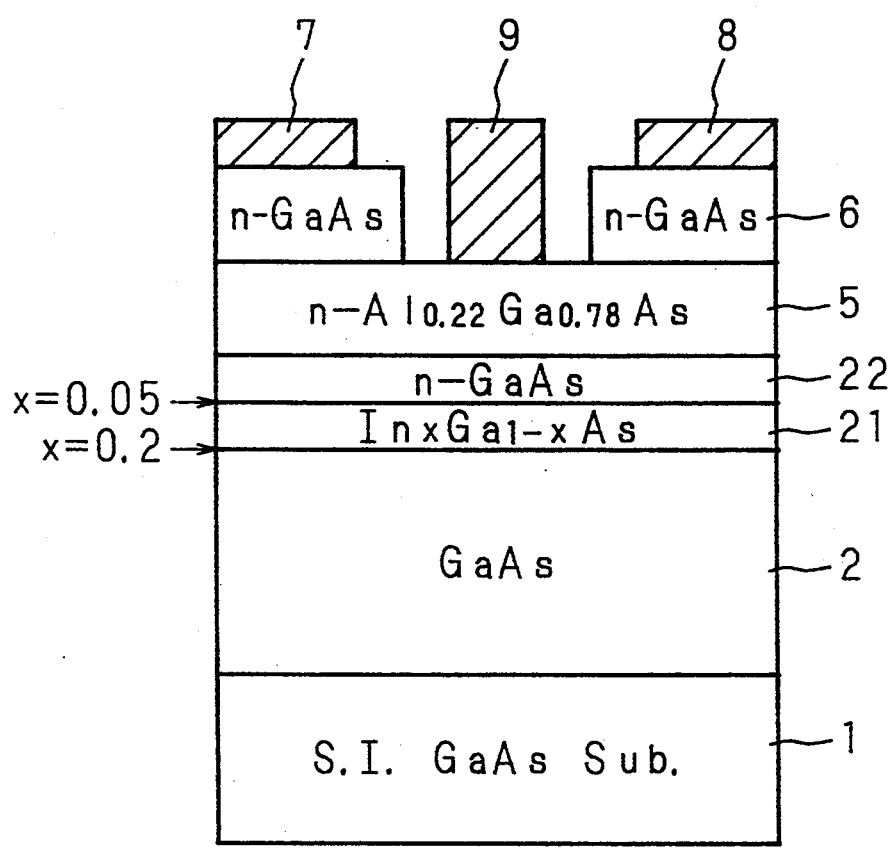
FIG. 4 is a schematic cross-sectional view showing the structure of a field-effect transistor according to a second embodiment of the invention.

FIG. 4 is a schematic cross-sectional view showing the structure of a field-effect transistor according to the second invention. In the figure, the reference numeral 1 designates a semi-insulating GaAs substrate (a semiconductor substrate). On the GaAs substrate 1, the following layers are formed one on top of another in the order stated: an undoped GaAs layer 2 as a buffer layer (a first buffer layer) (thickness: up to 8000 Å); an undoped In$_x$Ga$_{1-x}$As layer 21 (a second semiconductor layer) with the composition ratio of In decreasing in a graded manner from the substrate to the electrode side (composition ratio of In: 0.2 (substrate side), 0.05 (electrode side), thickness: 100 Å); an n-type n-GaAs layer 22 (a third semiconductor layer) (doping concentration: $1.5 \times 10^{18}$ cm$^{-3}$, thickness: 400 Å); an n-type n-AlGaAs layer 5 (a fourth semiconductor layer) (composition ratio of Al: 0.22, doping concentration: $2 \times 10^{18}$ cm$^{-3}$, thickness: 400 Å) ; and an n-type n-GaAs layer 6 as a capping layer (doping concentration: $3 \times 10^{18}$ cm$^{-3}$, thickness: 500 Å). In this embodiment, the combined thickness of the $In_xGa_{1-x}As$ layer 21, and n-GaAs layer 22, sandwiched between the GaAs layer 2 and the n-AlGaAs layer 5, is made large enough that the potential well formed by the conduction band potential difference between the GaAs layer 2 and the n-AlGaAs layer 5 cannot provide the effect of quantum-mechanical electron confinement. That is, these are not made to form a single quantum well. A source electrode 7 is connected to one side of the n-GaAs layer 6 to the other side of which is connected a drain electrode 8. Formed between the source electrode 7 and the drain electrode 8 is a gate electrode 9 (gate length: 0.2 μm, gate width: 200 μm) forming a Schottky junction with the n-AlGaAs layer 5.

In the field-effect transistor of the second embodiment shown in FIG. 4, when the gate potential is deep, electrons mostly travel through the $In_xGa_{1-x}$ As layer 21, and when the gate potential is shallow, electrons mostly travel through the n-GaAs layer 22, thus achieving both superior low-noise operation and high output operation as with the field-effect transistor of the first embodiment shown in FIG. 2. Superior low-noise and high output characteristics can thus be obtained with a single device structure.

Figure 5:
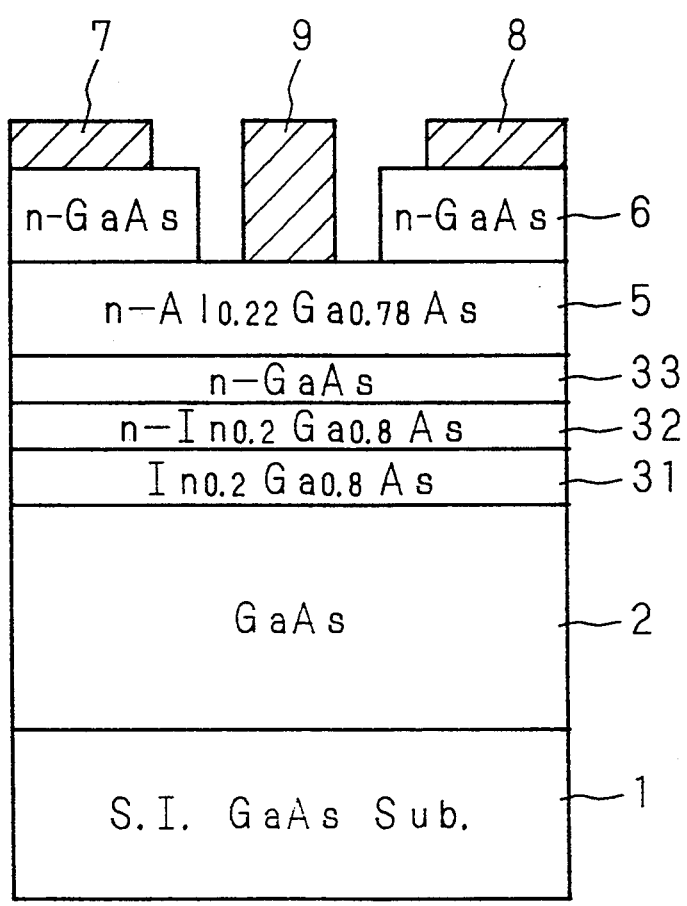
FIG. 5 is a schematic cross-sectional view showing the structure of a prior art field-effect transistor as a comparative example for comparison with the present invention.

Next, we will describe the results obtained by examining the noise characteristics of the field-effect transistors of the present invention. FIG. 5 is a schematic cross-sectional view showing the structure of a prior art field-effect transistor as a comparative example for comparison with the present invention. In the figure, the same parts as those shown in FIGS. 2 and 4 are designated by the same reference numerals, and explanation of such parts is not given here. As shown, an undoped InGaAs layer 31 (composition ratio of In: 0.2, thickness: 100 Å), an n-type n-InGaAs layer 32 (composition ratio of In: 0.2, doping concentration: $2.5 \times 10^{18}$ cm$^{-3}$, thickness: 50 Å), and an n-type n-GaAs layer 33 (doping concentration: $1.5 \times 10^{18}$ cm$^{-3}$, thickness: 400 Å) are formed in this order between the GaAs layer 2 and the n-AlGaAs layer 5.

Samples of field-effect transistors were built, i.e. Sample A for the first embodiment shown in FIG. 2, Sample B for the second embodiment shown in FIG. 4, and Sample C for the comparative example shown in FIG. 5, and the maximum transconductance (gm max) and the minimum noise figure (NFmin) at 12 GHz (Vds=2 V, Ids=10 mA) were measured for each sample. The results are shown in Table 1 below.

TABLE 1

|  | A | B | C |
| --- | --- | --- | --- |
| gm max | 550 ms/mm | 532 mS/mm | 535 mS/mm |
| NF min | 0.49 dB | 0.51 dB | 0.61 dB |

As can be seen from Table 1, despite the maximum transconductance being about the same for all three samples, the transistors of the present invention (Samples A and B) exhibit a lower minimum noise figure, and hence improve noise characteristics at higher frequencies, as compared to the prior art transistor (Sample C).

(Third Embodiment)

Figure 6:
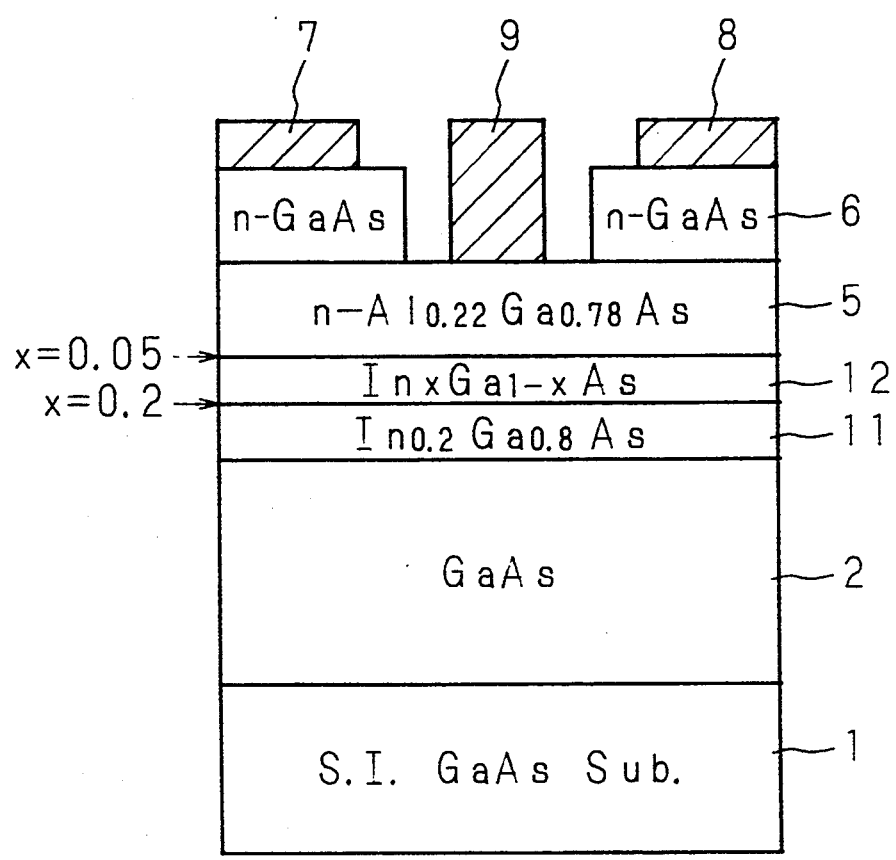
FIG. 6 is a schematic cross-sectional view showing the structure of a field-effect transistor according to a third embodiment of the invention.

FIG. 6 is a schematic cross-sectional view showing the structure of a field-effect transistor according to another embodiment of the first invention. The structure of this embodiment is identical to that of the transistor shown in FIG. 2, except that the n-GaAs layer 13 in the structure shown in FIG. 2 is eliminated; the same reference numerals designate the same parts as shown in FIG. 2, and explanation of such parts is not given herein. In this embodiment, when the gate potential is deep, electrons mostly travel through the $In_xGa_{1-x}As$ layer 12 and InGaAs layer 11, as in the first embodiment shown in FIG. 2, but when the gate potential is shallow, electrons mostly travel through the n-AlGaAs layer 5. Since the electron velocity is greatly reduced in the n-AlGaAs layer compared to the n-GaAs layer, the transconductance becomes smaller, and therefore, with the structure of this embodiment, it is difficult to obtain the superior high output characteristic achieved by the first embodiment. However, the structure of this embodiment is as effective as that of the first embodiment in achieving superior low-noise characteristic.

(Fourth Embodiment)

Figure 7:
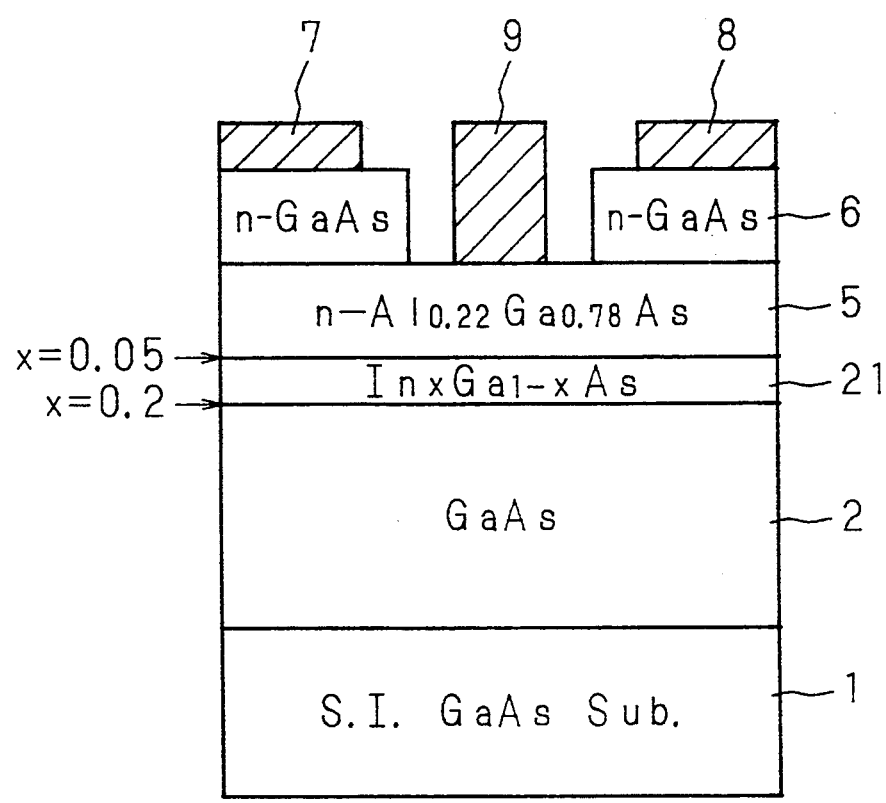
FIG. 7 is a schematic cross-sectional view showing the structure of a field-effect transistor according to a fourth embodiment of the invention.

FIG. 7 is a schematic cross-sectional view showing the structure of a field-effect transistor according to another embodiment of the second invention. The structure of this embodiment is identical to that of the transistor shown in FIG. 4, except that the n-GaAs layer 22 in the structure shown in FIG. 4 is eliminated; the same reference numerals designate the same parts as shown in FIG. 4, and explanation of such parts is not given herein. In this embodiment, when the gate potential is deep, electrons mostly travel through the $In_xGa_{1-x}As$ layer 21, as in the second embodiment shown in FIG. 4, but when the gate potential is shallow, electrons mostly travel through the n-AlGaAs layer 5. Since the electron velocity is greatly reduced in the n-AlGaAs layer compared to the n-GaAs layer, the transconductance becomes smaller, and therefore, with the structure of this embodiment, it is difficult to obtain the superior high output characteristic achieved by the second embodiment. However, the structure of this embodiment is as effective as that of the second embodiment in achieving superior low-noise characteristic.

Figure 8:
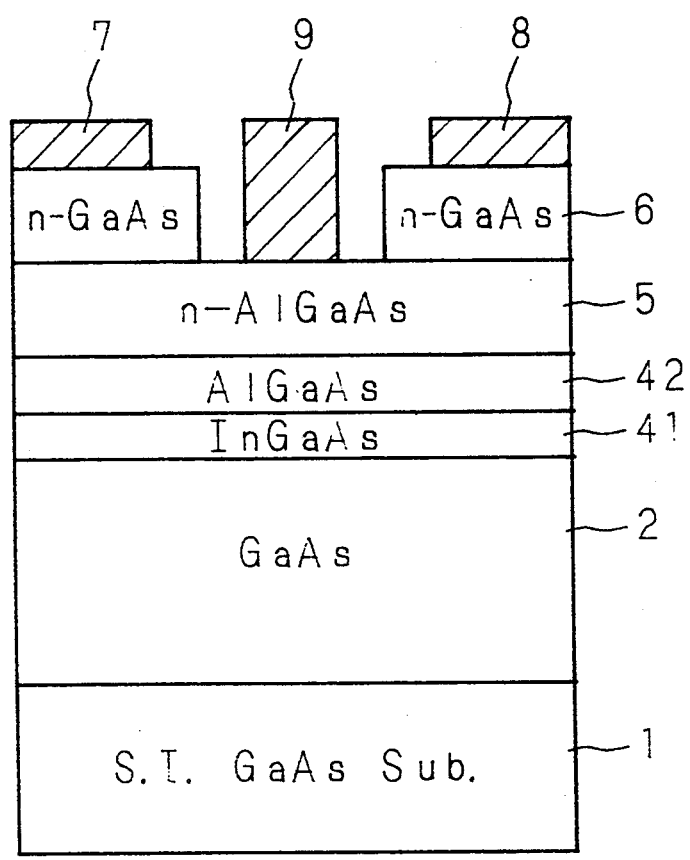
FIG. 8 is a schematic cross-sectional view showing the structure of a prior art field-effect transistor as a comparative example for comparison with the present invention.
Figure 9:
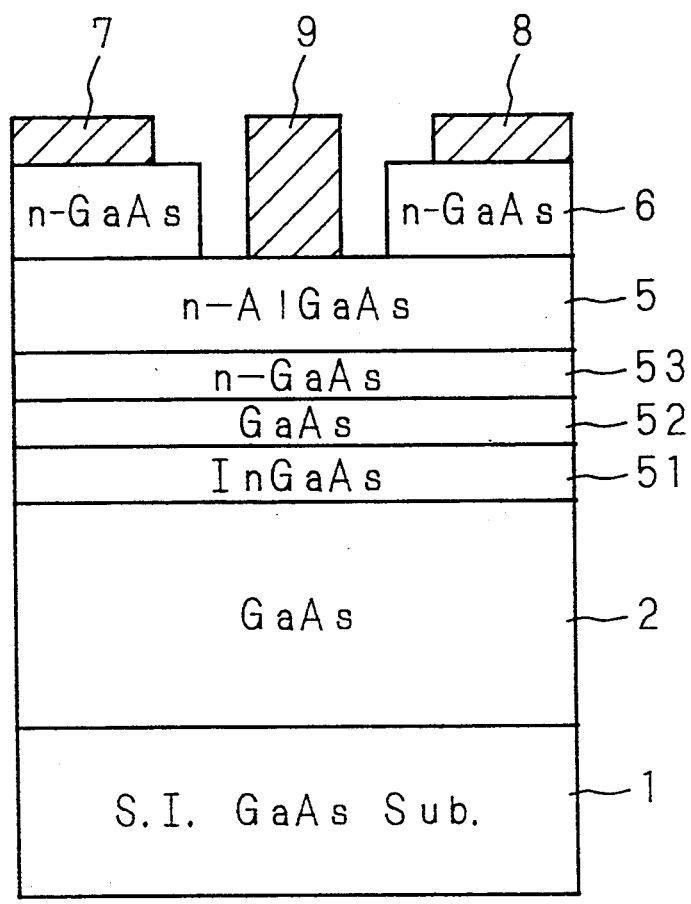
FIG. 9 is a schematic cross-sectional view showing the structure of a prior art field-effect transistor as a comparative example for comparison with the present invention.
Figure 10:
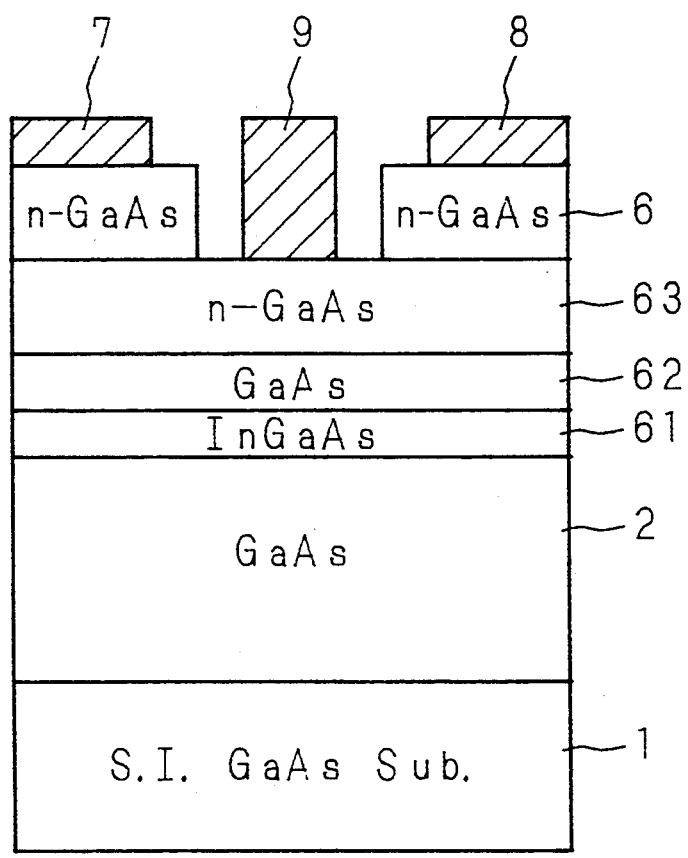
FIG. 10 is a schematic cross-sectional view showing the structure of a prior art field-effect transistor as a comparative example for comparison with the present invention.

The following describes the characteristics of the field-effect transistor of the invention by comparison with the characteristics of a high electron mobility transistor (HEMT). FIG. 8 is a schematic cross-sectional view showing the structure of an AlGaAs/InGaAs HEMT as a comparative example for comparison with the present invention. In FIG. 8, the same parts as those shown in FIGS. 2 and 4 are designated by the same reference numerals, and explanation of such parts is not given here. As shown, an undoped InGaAs layer 41 (composition ratio of In: 0.2, thickness: 100 Å) and an undoped AlGaAs layer 42 (composition ratio of Al: 0.22, thickness: 20 Å) are formed in this order between the GaAs layer 2 and the n-AlGaAs layer 5. FIGS. 9 and 10 are schematic cross-sectional views each showing the structure of a GaAs/InGaAs HEMT as a comparative example for comparison with the present invention. In FIGS. 9 and 10, the same parts as those shown in FIGS. 2 and 4 are designated by the same reference numerals, and explanation of such parts is not given here. In the HEMT shown in FIG. 9, an undoped InGaAs layer 51 (composition ratio of In: 0.2, thickness: 100 Å), an undoped GaAs layer 52 (thickness: 20 Å), and an n-type n-GaAs layer 53 doping concentration: $1.5 \times 10^{18}$ cm$^{-3}$, thickness: 400 Å) are formed in this order between the GaAs layer 2 and the n-AlGaAs layer 5. In the HEMT shown in FIG. 10, an undoped InGaAs layer 61 (composition ratio of In: 0.2, thickness: 100 Å), an undoped GaAs layer 62 (thickness: 20 Å), and an n-type n-GaAs layer 63 (doping concentration: $1.5 \times 10^{18}$ cm$^{-3}$, thickness: 800 Å) are formed in this order between the GaAs layer 2 and the n-GaAs layer 6.

Samples of field-effect transistors were built, i.e., Sample A for the first embodiment shown in FIG. 2, Sample D for the comparative example shown in FIG. 8, Sample E for the comparative example shown in FIG. 9, and Sample F for the comparative example shown in FIG. 10, and the dependence of transconductance on gate voltage and the dependence of noise figure on drain current were examined for each sample.

Figure 11:
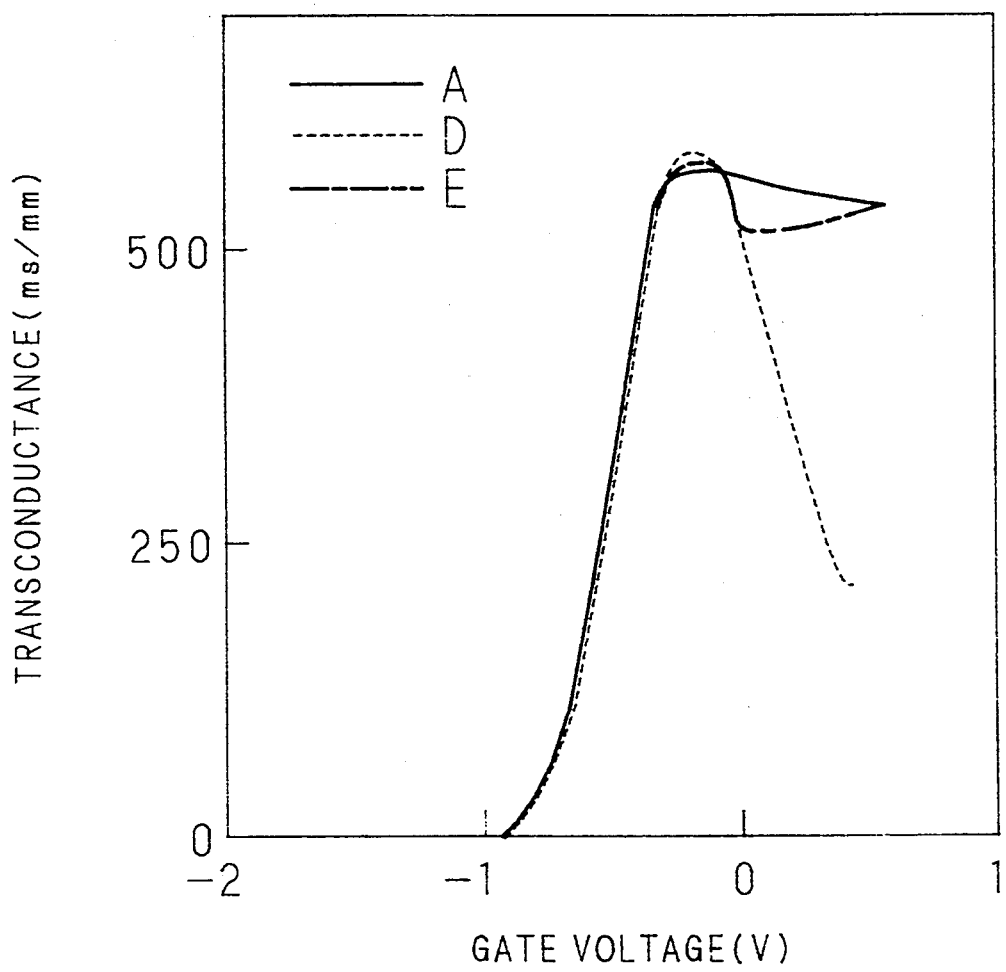
FIG. 11 is a graph showing the dependence of transconductance on gate voltage compared between the present invention and prior art field-effect transistors.

FIG. 11 shows the dependence of transconductance (gm) on gate voltage for each of Samples A, D, and E. The transconductance rises with the gate voltage with almost the same steepness for all the three samples. However, at gate voltages above about −0.3 V, in Sample A the gm remains substantially flat despite increasing gate voltage; by contrast, in Sample D, the gm abruptly drops, and in Sample E, the gm exhibits an undulating characteristic, once dropping and then increasing again. The flat and high gm characteristic observed in Sample A shows that Sample A of the present invention can be used as a high-efficiency power device as well as a low-distortion power device.

Figure 12:
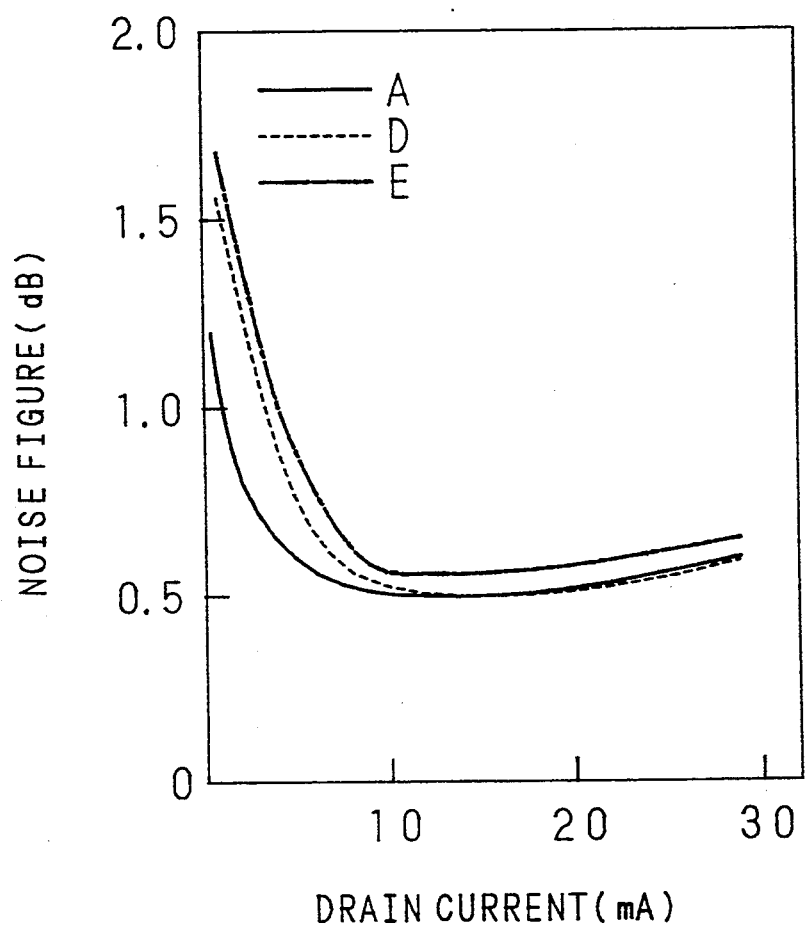
FIG. 12 is a graph showing the dependence of noise figure on drain current compared between the present invention and prior art field-effect transistors.

FIG. 12 shows the dependence of noise figure (NF) on drain current Ids for each of Samples A, D, and E. When attention is focused on Samples A and D, it is shown that Samples A and D both exhibit almost the same NF characteristic over the middle and higher regions of Ids, but in the lower regions of Ids, Sample A exhibits a low-NF characteristic far superior to that of Sample D. Sample E is inferior to Sample D over the entitle drain current region.

In the case of Sample F, the transconductance showed substantially the same tendency as that of Sample E. The noise figure NF for Sample F was 0.59 dB at Ids=10 mA as compared to NF=0.56 dB for Sample E, the noise figure characteristic of Sample F thus being slightly inferior to that of Sample E in the Ids region over which the measurements were made.

As shown, Sample A of the present invention not only realizes a flat and high gm, which has not been possible with the HEMT, but achieves a low-noise characteristic superior to that of the HEMT.

(Fifth Embodiment)

Figure 13:
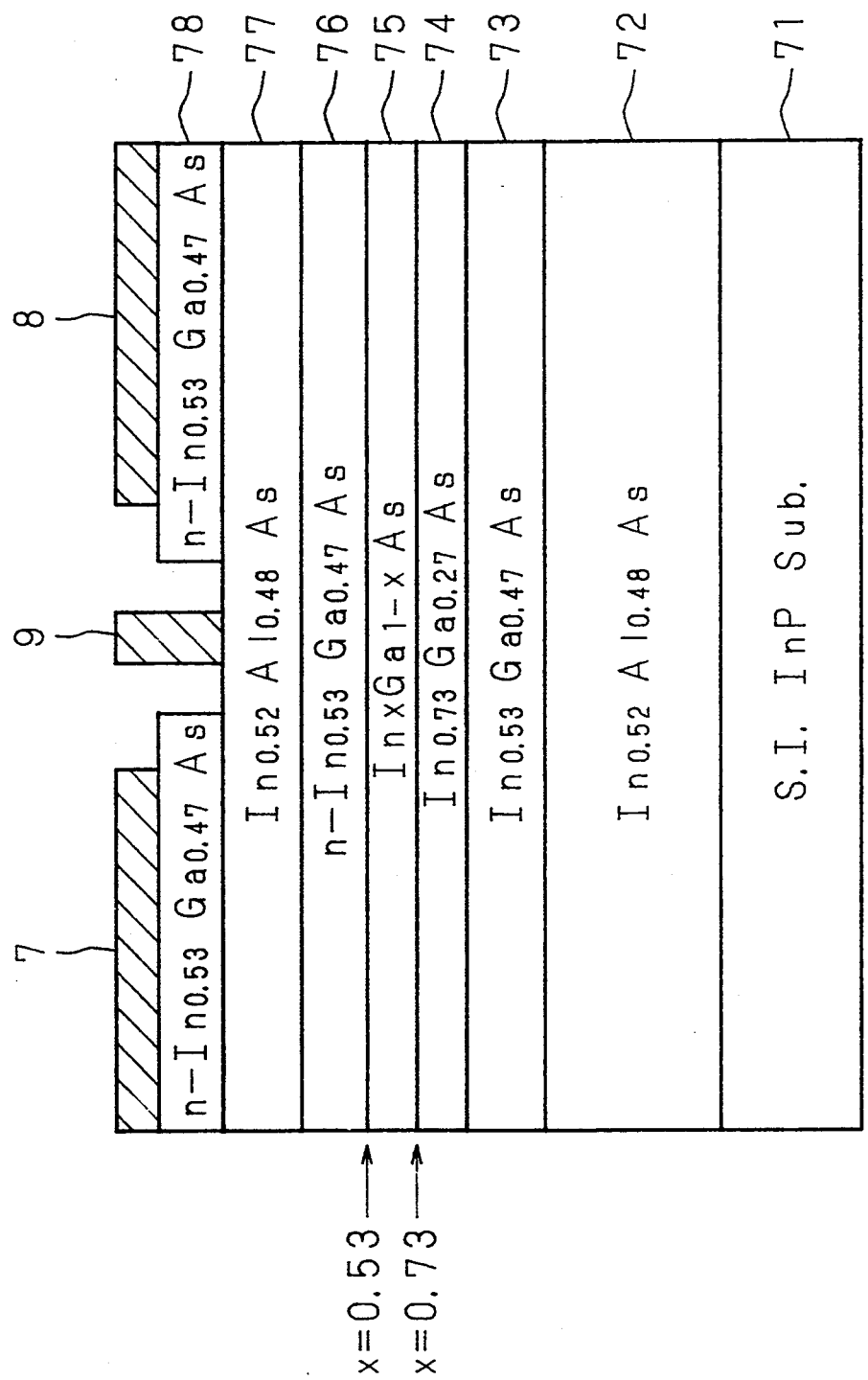
FIG. 13 is a schematic cross-sectional view showing the structure of a field-effect transistor according to a fifth embodiment of the invention.

FIG. 13 is a schematic cross-sectional view showing an alternative structure of the field-effect transistor of the first invention. In the figure, the reference numeral 71 designates a semi-insulating InP substrate (a semiconductor substrate). On the InP substrate 71, the following layers are formed one on top of another in the order stated: an undoped InAlAs layer 72 (composition ratio of In: 0.52, thickness: 2000 Å); an undoped InGaAs layer 73 (a first semiconductor buffer layer) (composition ratio of In: 0.53, thickness: 500 Å); an undoped InGaAs layer 74 (a second semiconductor layer) (composition ratio of In: 0.73, thickness: 50 Å); an undoped $In_xGa_{1-x}As$ layer 75 (a third semiconductor layer) with the composition ratio of In decreasing in a graded manner from the substrate to the electrode side (composition ratio of In: 0.73 (substrate side), 0.53 (electrode side), thickness: 50 Å); an n-type n-InGaAs layer 76 (a fourth semiconductor layer) (composition ratio of In: 0.53, doping concentation: $2.5 \times 10^{18}$ cm$^{-3}$, thickness: 300 Å); an undoped InAlAs layer 77 (a fifth semiconductor layer) (composition ratio of In: 0.52, thickness: 200 Å); and an n-type n-InGaAs layer 78 as a capping layer (composition ratio of In: 0.53, doping concentration: $3 \times 10^{18}$ cm$^{-3}$, thickness: 500 Å). A source electrode 7 is connected to one side of the n-InGaAs layer 78 to the other side of which is connected a drain electrode 8. Formed between the source electrode 7 and the drain electrode 8 is a gate electrode 9 forming a Schottky junction with the InAlAs layer 77.

In this embodiment, when the gate potential is deep, electrons mostly travels through the InGaAs layer 74 and $In_xGa_{1-x}As$ layer 75, and when the gate potential is shallow, electrons mostly travels through the n-InGaAs layer 76. Thus, in this embodiment also, there exist two electron transport modes. Therefore, as in the first embodiment (the structure shown in FIG. 2), when the gate potential is deep, superior low-noise characteristic is exhibited, and when the gate potential is shallow, high output characteristic is achieved.

(Sixth Embodiment)

Figure 14:
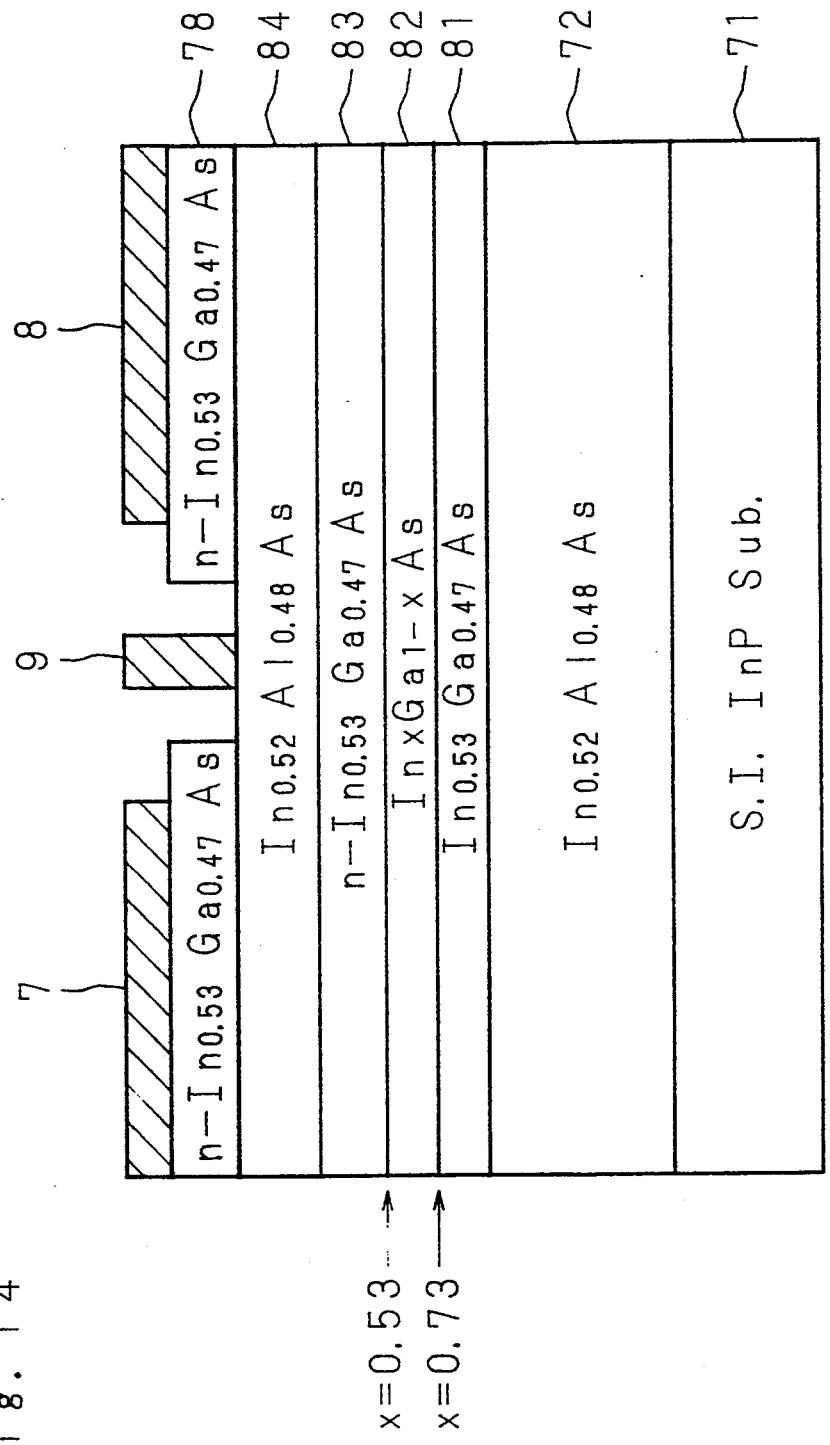
FIG. 14 is a schematic cross-sectional view showing the structure of a field-effect transistor according to a sixth embodiment of the invention.

FIG. 14 is a schematic cross-sectional view showing an alternative structure of the field-effect transistor of the second invention. In the figure, the reference numeral 71 designates a semi-insulating InP substrate (a semiconductor substrate). On the InP substrate 71, the following layers are formed one on top of another in the order stated: an undoped InAlAs layer 72 (composition ratio of In: 0.52, thickness: 2000 Å); an undoped InGaAs layer 81 (a first semiconductor buffer layer) (composition ratio of In: 0.53, thickness: 500 Å); an undoped $In_xGa_{1-x}As$ layer 82 (a second semiconductor layer) with the composition ratio of In decreasing in a graded manner from the substrate to the electrode side (composition ratio of In: 0.73 (substrate side), 0.53 (electrode side), thickness: 100 Å); an n-type n-InGaAs layer 83 (a third semiconductor layer) (composition ratio of In: 0.53, doping concentration: $2.5 \times 10^{18}$ cm$^{-3}$, thickness: 300 Å); an undoped InAlAs layer 84 (a fourth semiconductor layer) (compositions ratio of In: 0.52, thickness: 200 Å); and an n-type n-InGaAs layer 78 as a capping layer (composition ratio of In: 0.53, doping concentration: $3 \times 10^{18}$ cm$^{-3}$ thickness: 500 Å) A source electrode 7 is connected to one side of the n-InGaAs layer 78 to the other side of which is connected a drain electrode 8. Formed between the source electrode 7 and the drain electrode 8 is a gale electrode 9 forming a Schottky junction with the InAlAs layer 84.

In the field-effect transistor of the sixth embodiment; shown in FIG. 14, when the gate potential is deep, electrons mostly travel through the $In_xGa_{1-x}As$ layer 82, and when the gate potential is shallow, electrons mostly travel through the n-InGaAs layer 83, thus achieving both superior low-noise operation and high output operation as in the field-effect transistor of the fifth embodiment shown in FIG. 13. Superior low-noise and high output characteristics can thus be obtained with a single device structure.

Samples of field-effect transistors, with the gate electrode of gate length 0.1.5 μm, gate width 50 μm, were built, i.e., Sample G for the fifth embodiment shown in FIG. 13, Sample H for the sixth embodiment shown in FIG. 14, and Sample A for the first embodiment shown in FIG. 2, and gm max and NFmin at 60 GHz were measured for each sample. The results are shown in Table 2 below.

TABLE 2

|  | A | G | H |
| --- | --- | --- | --- |
| gm max | 580 mS/mm | 1100 ms/mm | 1070 mS/mm |
| NF min | 1.5 dB | 0.7 dB | 0.75 dB |

From Table 2, it can be seen that in Samples G and H, both characteristics, gm and NF, are greatly improved as compared to Sample A. When the dependence of gm on gate voltage is viewed over the gate voltage range of −0.3 to +0.5 V, the gm varies within the range of 1100 to 1050 mS/mm for Sample G and 1070 to 1010 mS/ram for Sample H, thus exhibiting a substantially flat gm characteristic as with Sample A shown in FIG. 11.

As can be seen from the fifth and sixth-embodiments shown in FIGS. 13 and 14, the unique advantage of the invention (achieving superior low-noise operation and high output operation with varied gate potential) can be obtained even when an undoped semiconductor layer is used instead of the semiconductor layer of one conductivity type which is the fifth layer in the first invention and the fourth layer in the second invention.

Furthermore, as can be seen from the fifth and sixth embodiments shown in FIGS. 13 and 14, the unique advantage of the invention can be obtained even when an additional semiconductor layer is inserted between the semiconductor substrate and the first semiconductor buffer layer in both the first and the second invention.

In any of the above-described embodiments, a semiconductor layer doped throughout is used as the fourth semiconductor layer in the case of the first invention and the third semiconductor layer in the case of the second invention; however, these layers may be replaced by an undoped semiconductor layer containing therein an atomic planar doping layer or a pulse doping layer. Examples of such an alternative structure will be described below by taking the n-InGaAs layer 76 (the fourth semiconductor layer in the first invention) in the fifth embodiment shown in FIG. 13 as an example.

Figure 15:
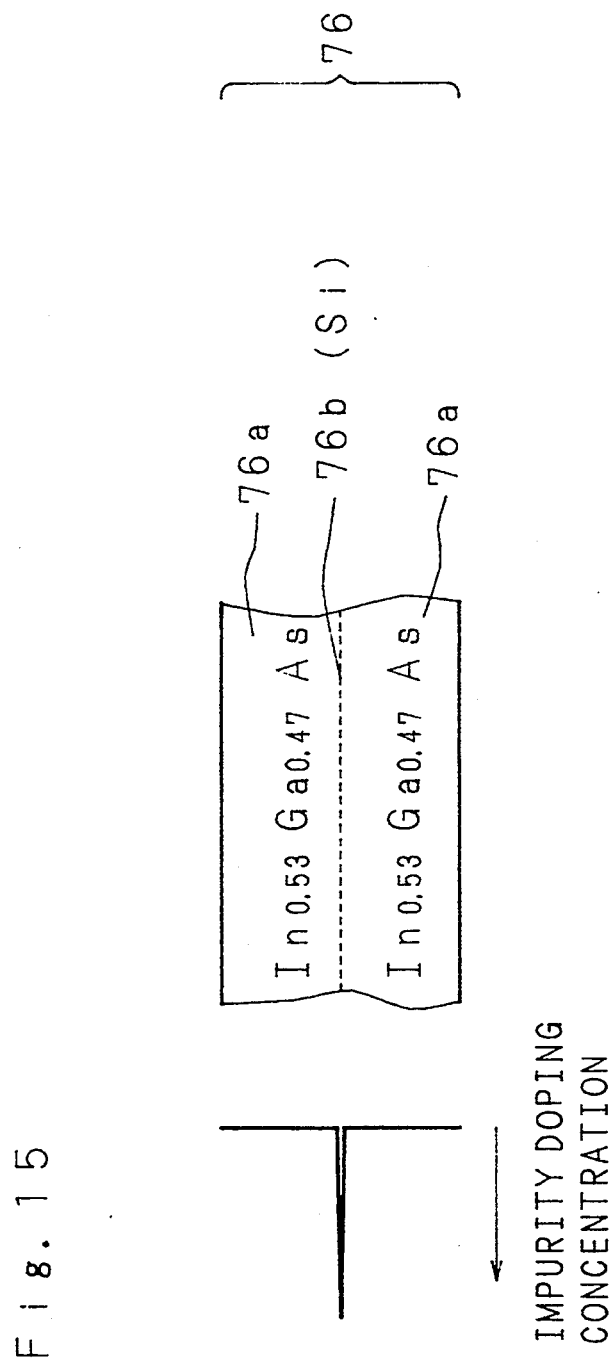
FIG. 15 is a schematic cross-sectional view showing an alternative structure of a semiconductor layer of one conductivity type.

FIG. 15 shows the structure of the n-InGaAs layer 76 containing an atomic planar doping layer, and its impurity doping concentration. The n-InGaAs layer 76 consists of an undoped InGaAs layer 76a (composition ratio of In: 0.53) and an atomic planar layer 76b formed therein from a monoatomic layer of impurities such as Si.

Figure 16:
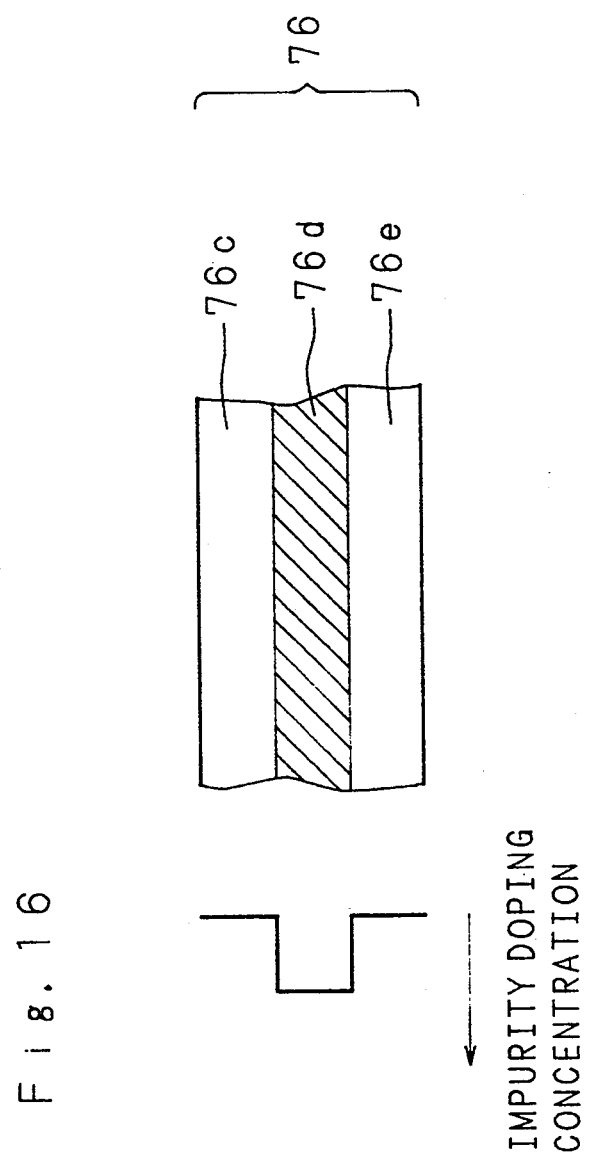
FIG. 16 is a schematic cross,sectional view showing an alternative structure of the semiconductor layer of one conductivity type.

FIG. 16 shows the structure of the n-InGaAs layer 76 containing a pulse doping layer, and its impurity doping concentration. The n-InGaAs layer 76 has a layered structure consisting of an undoped (or lowly doped) InGaAs layer 76c (composition ratio of In: 0.53), a highly doped InGaAs layer 76d (composition ratio of It: 0.53), and an undoped (or lowly doped) InGaAs layer 76e (composition ratio of In: 0.53).

A semiconductor layer formed by layering the structures of FIGS. 15 and 16 one on top of the other may be used as the fourth semiconductor layer in the first invention as well as the third semiconductor layer in the second invention.

The gate electrode used in the invention is not limited to the structure described above. In any of the above embodiments, recess etching is performed to etch the capping layer and expose the surface of the fifth semiconductor layer in the case of the first invention, or the fourth semiconductor layer in the case of the second invention, the gate electrode then being formed on the exposed surface. However, the fifth semiconductor layer in the first invention, or the fourth semiconductor layer in the second invention, may be further etched to some depth, and then, the gate electrode may be formed thereon.

Examples of various possible combinations of the semiconductor layers will be shown below for the structures of the first and the second invention.

Table 3 below shows examples of various combinations of the semiconductor layers in the structure of the first invention when the fifth semiconductor layer is of one conductivity type, the examples including ones illustrated in the foregoing embodiments. Table 4 below shows examples of various combinations of the semiconductor layers in the structure of the second invention when the fourth semiconductor layer is of one conductivity type, the examples including ones illustrated in the foregoing embodiments. Table 5 below shows examples of various combinations of the semiconductor layers in the structure of the first invention when the fifth semiconductor layer is an undoped layer, the examples including ones illustrated in the foregoing embodiments. Table 6 below shows examples of various combinations of the semiconductor layers in the structure of the second invention when the fourth semiconductor layer is an undoped layer, the examples including ones illustrated in the foregoing embodiments.

TABLE 3

| 1st Semiconductor Buffer Layer | Undoped 2nd Semiconductor Layer | Undoped 3rd Semiconductor Layer | 4th Semiconductor Layer Of One Conductivity Type | 5th Semiconductor Layer Of One Conductivity Type |
|---|---|---|---|---|
| GaAs | InGaAs | Graded InGaAs | n-GaAs | n-AlGaAs |
| AlGaAs | InGaAs | Graded InGaAs | n-GaAs | n-AlGaAs |
| GaAs | InGaAs | Graded InGaAs | n-GaAs | n-GaAs |
| AlGaAs | InGaAs | Graded InGaAs | n-GaAs | n-GaAs |
| InGaAs | InGaAs | Graded InGaAs | n-InGaAs | n-InAlAs |
| InAlAs | InGaAs | Graded InGaAs | n-InGaAs | n-InAlAs |
| InP | InGaAs | Graded InGaAs | n-InGaAs | n-InAlAs |
| InGaAs | InGaAs | Graded InGaAs | n-InGaAs | n-InP |
| InAlAs | InGaAs | Graded InGaAs | n-InGaAs | n-InP |
| InP | InGaAs | Graded InGaAs | n-InGaAs | n-InP |
| InP | InGaAsP | Graded InGaAsP | n-InGaAsP | n-InP |
| InP | InGaAsP | Graded | n-InGaAsP | n-InGaAsP |

TABLE 3-continued

| 1st Semiconductor Buffer Layer | Undoped 2nd Semiconductor Layer | Undoped 3rd Semiconductor Layer | 4th Semiconductor Layer Of One Conductivity Type | 5th Semiconductor Layer Of One Conductivity Type |
|---|---|---|---|---|
| InP | InGaAsP | Graded InGaAsP | n-InP | n-InP |
| GaAs | InGaAs | Graded InGaAs | n-AlGaAs | n-AlGaAs |
| InGaAs | InGaAs | Graded InGaAs | n-InAlAs | n-InAlAs |
| InGaAs | InGaAs | Graded InGaAs | n-InP | n-InP |

TABLE 4

| 1st Semiconductor Buffer Layer | Undoped 2nd Semiconductor Layer | 3rd Semiconductor Layer Of One Conductivity Type | 4th Semiconductor Layer Of One Conductivity Type |
|---|---|---|---|
| GaAs | Graded InGaAs | n-GaAs | n-AlGaAs |
| AlGaAs | Graded InGaAs | n-GaAs | n-AlGaAs |
| GaAs | Graded InGaAs | n-GaAs | n-GaAs |
| AlGaAs | Graded InGaAs | n-GaAs | n-GaAs |
| InGaAs | Graded InGaAs | n-InGaAs | n-InAlAs |
| InAlAs | Graded InGaAs | n-InGaAs | n-InAlAs |
| InP | Graded InGaAs | n-InGaAs | n-InAlAs |
| InGaAs | Graded InGaAs | n-InGaAs | n-InP |
| InAlAs | Graded InGaAs | n-InGaAs | n-InP |
| InP | Graded InGaAs | n-InGaAs | n-InP |
| InP | Graded InGaAsP | u-InGaAsP | n-InP |
| InP | Graded InGaAsP | n-InGaAsP | n-InGaAsP |
| InP | Graded InGaAsP | n-InP | n-InP |
| GaAs | Graded InGaAs | n-AlGaAs | n-AlGaAs |
| InGaAs | Graded InGaAs | n-InAlAs | n-InAlAs |
| InGaAs | Graded InGaAs | n-InP | n-InP |

TABLE 5

| 1st Semiconductor Buffer Layer | Undoped 2nd Semiconductor Layer | Undoped 3rd Semiconductor Layer | 4th Semiconductor Layer Of One Conductivity Type | Undoped 5th Semiconductor Layer |
|---|---|---|---|---|
| GaAs | InGaAs | Graded InGaAs | n-GaAs | AlGaAs |
| AlGaAs | InGaAs | Graded InGaAs | n-GaAs | AlGaAs |
| GaAs | InGaAs | Graded InGaAs | n-GaAs | GaAs |
| AlGaAs | InGaAs | Graded InGaAs | n-GaAs | GaAs |
| InGaAs | InGaAs | Graded InGaAs | n-InGaAs | InAlAs |
| InAlAs | InGaAs | Graded InGaAs | n-InGaAs | InAlAs |
| InP | InGaAs | Graded InGaAs | n-InGaAs | InAlAs |
| InGaAs | InGaAs | Graded InGaAs | n-InGaAs | InP |
| InAlAs | InGaAs | Graded InGaAs | n-InGaAs | InP |
| InP | InGaAs | Graded InGaAs | n-InGaAs | InP |
| InP | InGaAsP | Graded InGaAsP | n-InGaAsP | InP |
| InP | InGaAsP | Graded InGaAsP | n-InGaAsP | InGaAsP |
| InP | InGaAsP | Graded InGaAsP | n-InP | InP |
| GaAs | InGaAs | Graded InGaAs | n-AlGaAs | AlGaAs |
| InGaAs | InGaAs | Graded InGaAs | n-InAlAs | InAlAs |
| InGaAs | InGaAs | Graded InGaAs | n-InP | InP |

TABLE 6

| 1st Semiconductor Buffer Layer | Undoped 2nd Semiconductor Layer | 3rd Semiconductor Layer Of One Conductivity Type | Undoped 4th Semiconductor Layer |
| --- | --- | --- | --- |
| GaAs | Graded InGaAs | n-GaAs | AlGaAs |
| AlGaAs | Graded InGaAs | n-GaAs | AlGaAs |
| GaAs | Graded InGaAs | n-GaAs | GaAs |
| AlGaAs | Graded InGaAs | n-GaAs | GaAs |
| InGaAs | Graded InGaAs | n-InGaAs | InAlAs |
| InAlAs | Graded InGaAs | n-InGaAs | InAlAs |
| InP | Graded InGaAs | n-InGaAs | InAlAs |
| InGaAs | Graded InGaAs | n-InGaAs | InP |
| InAlAs | Graded InGaAs | n-InGaAs | InP |
| InP | Graded InGaAs | n-InGaAs | InP |
| InP | Graded InGaAsP | n-InGaAsP | InP |
| InP | Graded InGaAsP | n-InGaAsP | InGaAsP |
| InP | Graded InGaAsP | n-InP | InP |
| GaAs | Graded InGaAs | n-AlGaAs | AlGaAs |
| InGaAs | Graded InGaAs | n-InAlAs | InAlAs |
| InGaAs | Graded InGaAs | n-InP | InP |

As described above, in the field-effect transistor of the present invention, an undoped semiconductor layer the forbidden band gap of which varies in a graded manner from the substrate to the electrode side is provided adjacent to a highly doped semiconductor layer. Accordingly, when electrons are made to flow through the undoped semiconductor layer, superior low-noise characteristic is exhibited, and when electrons are made to flow through the highly doped layer, high output characteristic is achieved. The device thus has both low-noise and high output characteristics. The use of the device structure of the invention allows the fabrication of a single-chip transmitter/receiver MMIC (monolithic microwave integrated circuit) integrating thereon a low-noise MMIC, a high-output MMIC, etc. used for microwave or millimeter wave communications. This achieves a reduction in cost while improving the performance.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A field-effect semiconductor device comprising semiconductor layers formed on a semiconductor substrate in the order listed below:
   a first semiconductor buffer layer;
   an undoped second semiconductor layer;
   an undoped third semiconductor layer;
   a fourth semiconductor layer of a first conductivity type; and
   a fifth semiconductor layer of said first conductivity type; wherein
   the electron affinity of the second semiconductor layer is greater than that of the first semiconductor buffer layer, the electron affinity of the third semiconductor layer at the interface with the second semiconductor layer is not greater than that of the second semiconductor layer, the forbidden band gap of the third semiconductor layer increases in a graded manner from the second semiconductor layer to the fourth semiconductor layer side, the electron affinity of the third semiconductor layer at the interface with the fourth semiconductor layer is not smaller than that of the fourth semiconductor layer, and the electron affinity of the fifth semiconductor layer is not greater than that of the fourth semiconductor layer.

2. A field-effect semiconductor device according to claim 1, wherein
   the first semiconductor buffer layer is a layer selected from the group consisting of a GaAs layer, an AlGaAs layer, an InGaAs layer, an InAlAs layer, and an InP layer; the second semiconductor layer is a layer selected from the group consisting of an InGaAs layer and an InGaAsP layer; the third semiconductor layer is a layer selected from the group consisting of an InGaAs layer and an InGaAsP layer, the proportion of In decreasing in a graded manner from the second semiconductor layer to the fourth semiconductor layer side; the fourth semiconductor layer a layer selected from the group consisting of an n-type GaAs layer, an n-type InGaAs layer, an n-type InGaAsP layer, an n-type InP layer, an n-type AlGaAs layer, and an n-type InAlAs layer; and the fifth semiconductor layer is a layer selected from the group consisting of an n-type AlGaAs layer, an n-type GaAs layer, an n-type InAlAs layer, an n-type InP layer, and an n-type InGaAsP layer.

3. A field-effect semiconductor device according to claim 1, wherein
   the fourth semiconductor layer contains a layer selected from the group consisting of an atomic planar doping layer and a pulse doping layer.

4. A field-effect semiconductor device comprising semiconductor layers formed on a semiconductor substrate in the order listed below:
   a first semiconductor buffer layer;
   an undoped second semiconductor layer;
   a third semiconductor layer of a first conductivity type; and
   a fourth semiconductor layer of said first conductivity type; wherein
   the electron affinity of the second semiconductor layer at the interface with the First semiconductor buffer layer is greater than that of the first semiconductor buffer layer, the forbidden band gap of the second semiconductor layer increases in a graded manner from the first semiconductor buffer layer to the third semiconductor layer side, the electron affinity of the second semiconductor layer at the interface with the third semiconductor layer is not smaller than that of the third semiconductor layer, and the electron affinity of the fourth semiconductor layer is not greater than that of the third semiconductor layer.

5. A field-effect semiconductor device according to claim 4, wherein
the first semiconductor buffer layer is a layer selected from the group consisting of a GaAs layer, an AlGaAs layer, an InGaAs layer, an InAlAs layer, and an InP layer; the second semiconductor layer is a layer selected from the group consisting of an InGaAs layer and an InCaAsP layer, the proportion of In decreasing in a graded manner from the first semiconductor buffer layer to the third semiconductor layer side; the third semiconductor layer is a layer selected from the group consisting of an n-type GaAs layer, an n-type InGaAs layer, an n-type InCaAsP layer, an n-type InP layer, an n-type AlGaAs layer, and an n-type InAlAs layer; and the fourth semiconductor layer is a layer selected from the group consisting of an n-type AlGaAs layer, an n-type GaAs layer, an n-type InAlAs layer, an n-type InP layer, and an n-type InGaAsP layer.

6. A field-effect semiconductor device according to claim 4, wherein
the third semiconductor layer contains a layer selected from the group consisting of an atomic planar doping layer and a pulse doping layer.

7. A field-effect semiconductor device comprising semiconductor layers formed on a semiconductor substrate in the order listed below:
a first semiconductor buffer layer;
an undoped second semiconductor layer;
an undoped third semiconductor layer;
a fourth semiconductor layer of a first conductivity type; and
an undoped fifth semiconductor layer;
wherein
the electron affinity of the second semiconductor layer is greater than that of the first semiconductor buffer layer, the electron affinity of the third semiconductor layer at the interface with the second semiconductor layer is not greater than that of the second semiconductor layer, the forbidden band gap of the third semiconductor layer increases in a graded manner from the second semiconductor layer to the fourth semiconductor layer side, the electron affinity of the third semiconductor layer at the interface with the fourth semiconductor layer is not smaller than that of the fourth semiconductor layer, and the electron affinity of the fifth semiconductor layer is not greater than that of the fourth semiconductor layer.

8. A field-effect semiconductor device according to claim 7, wherein
the first semiconductor buffer layer is a layer selected from the group consisting of a GaAs layer, an AlGaAs layer, an InGaAs layer, an InAlAs layer, and an InP layer; the second semiconductor layer is ;a layer selected from the group consisting of an InGaAs layer and an InGaAsP layer; the third semiconductor layer is a layer selected from the group consisting of an InGaAs layer and an InGaAsP layer, the proportion of In decreasing in a graded manner from the second semiconductor layer to the fourth semiconductor layer side; the fourth semiconductor layer is a layer selected from the group consisting of an n-type GaAs layer, an n-type InGaAs layer, an n-type InGaAsP layer, an n-type InP layer, an n-type AlGaAs layer, and an n-type InAlAs layer; and the fifth semiconductor layer is a layer selected from the group consisting of an AlGaAs layer, a GaAs layer, an InAlAs layer, an InP layer, and an InGaAsP layer.

9. A field-effect semiconductor device according to claim 7, wherein
the fourth semiconductor layer contains a layer selected from the group consisting of an atomic planar doping layer and a pulse doping layer.

10. A field-effect semiconductor device comprising semiconductor layers formed on a semiconductor substrate in the order listed below:
a first semiconductor buffer layer;
an undoped second semiconductor layer;
a third semiconductor layer of a first conductivity type;
and
an undoped fourth semiconductor layer;
wherein
the electron affinity of the second semiconductor layer at the interface with the first semiconductor buffer layer is greater than that of the first semiconductor buffer layer, the forbidden band gap of the second semiconductor layer increases in a graded manner from the first semiconductor buffer layer to the third semiconductor layer side, the electron affinity of the second semiconductor layer at, the interface with the third semiconductor layer is not smaller than that of the third semiconductor layer, and the electron affinity of the fourth semiconductor layer is not greater than that of the third semiconductor layer.

11. A field-effect semiconductor device according to claim 10, wherein
the first semiconductor buffer layer is a layer selected from the group consisting of AlGaAs layer, an AlGaAs layer, an InGaAs layer, an InAlAs layer, and an InP layer; the second semiconductor layer is a layer selected from the group consisting of an InGaAs layer and an InGaAsP layer, the proportion of In decreasing in a graded manner from the first, semiconductor buffer layer to the third semiconductor layer side; the third semiconductor layer is a layer selected from the group consisting of an n-type GaAs layer, an n-type InGaAs layer, an n-type InGaAsP layer, an n-type InP layer, an n-type AlGaAs layer, and an n-type InAlAs layer; and the fourth semiconductor layer is a layer selected from the group consisting of an AlGaAs layer, a GaAs layer, an InAlAs layer, an InP layer, and an InGaAsP layer.

12. A field-effect semiconductor device according to claim 10, wherein
the third semiconductor layer contains a layer selected from the group consisting of an atomic planar doping layer and a pulse doping layer.

13. A field-effect transistor comprising:
a semiconductor substrate;
a first semiconductor buffer layer formed on the semiconductor substrate;
an undoped second semiconductor layer formed on the first semiconductor buffer layer;
an undoped third semiconductor layer formed on the second semiconductor layer;
a fourth semiconductor layer of a first conductivity type formed on the third semiconductor layer;
a fifth semiconductor layer of undoped type or said first conductivity type formed on the fourth semiconductor layer;

a contact layer of said first conductivity type formed on the fifth semiconductor layer;
a source electrode formed on the contact layer;
a drain electrode formed on the contact layer; and
a gate electrode formed on the fifth semiconductor layer;

wherein
the electron affinity of the second semiconductor layer is greater than that of the first semiconductor buffer layer, the electron affinity of the third semiconductor layer at the interface with the second semiconductor layer is not greater than that of the second semiconductor layer, the forbidden band gap of the third semiconductor layer increases in a graded manner from the second semiconductor layer to the fourth semiconductor layer side, the electron affinity of the third semiconductor layer at the interface with the fourth semiconductor layer is not smaller than that of the fourth semiconductor layer, and the electron affinity of the fifth semiconductor layer is not greater than that of the fourth semiconductor layer.

14. A field-effect transistor comprising:
a semiconductor substrate;
a first semiconductor buffer layer formed on the semiconductor substrate;
an undoped second semiconductor layer formed on the first semiconductor buffer layer;
a third semiconductor layer of a first conductivity type formed on the second semiconductor layer;
a fourth semiconductor layer of undoped type or said first conductivity type formed on the third semiconductor layer;
a contact layer of said first conductivity type formed on the fourth semiconductor layer;
a source electrode formed on the contact layer;
a drain electrode formed on the contact layer; and
a gate electrode formed on the fourth semiconductor layer;

wherein
the electron affinity of the second semiconductor layer at the interface with the first semiconductor buffer layer is greater than that of the first semiconductor buffer layer, the forbidden band gap of the second semiconductor layer increases in a graded manner from the first semiconductor buffer layer to the third semiconductor layer side, the electron affinity of the second semiconductor layer at the interface with the third semiconductor layer is not smaller than that of the third semiconductor layer, and the electron affinity of the fourth semiconductor layer is not greater than that of the third, semiconductor layer.

* * * * *